US012684944B2

(12) United States Patent
Lee et al.

(10) Patent No.: US 12,684,944 B2
(45) Date of Patent: Jul. 14, 2026

(54) DISPLAY APPARATUS AND METHOD OF MANUFACTURING THE SAME

(71) Applicant: Samsung Display Co., Ltd., Yongin-si (KR)

(72) Inventors: Kyunghee Lee, Yongin-si (KR); Mihwa Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 679 days.

(21) Appl. No.: 17/654,045

(22) Filed: Mar. 8, 2022

(65) Prior Publication Data

US 2023/0006172 A1 Jan. 5, 2023

(30) Foreign Application Priority Data

Jun. 18, 2021 (KR) ........................ 10-2021-0079522

(51) Int. Cl.

*H10K 59/50* (2023.01)
*H10K 59/12* (2023.01)
*H10K 59/80* (2023.01)

(52) U.S. Cl.

CPC ............. *H10K 59/12* (2023.02); *H10K 59/50* (2023.02); *H10K 59/8791* (2023.02); *H10K 59/8731* (2023.02)

(58) Field of Classification Search

CPC .... H10K 50/844; H10K 50/868; H10K 59/50; H10K 71/00; H10K 59/8791; H10K 59/8731; H10K 59/12; C09B 29/0003; C09B 27/00; C09K 19/02; G02B 5/3016; G02B 5/3083; G02F 1/13781

See application file for complete search history.

(56) References Cited

U.S. PATENT DOCUMENTS

| | | | | |
|---|---|---|---|---|
| 9,529,227 B2 | 12/2016 | Kim et al. | | |
| 9,753,200 B2 | 9/2017 | Lee et al. | | |
| 10,283,735 B2 | 5/2019 | Kim et al. | | |
| 2009/0195875 A1* | 8/2009 | Pasca ................. | G02B 27/0101 | 359/489.07 |
| 2013/0314647 A1* | 11/2013 | Yim .................. | H10K 59/8791 | 445/24 |

(Continued)

FOREIGN PATENT DOCUMENTS

| | | |
|---|---|---|
| KR | 10-2014-0086059 A | 7/2014 |
| KR | 10-2016-0118436 A | 10/2016 |

(Continued)

OTHER PUBLICATIONS

Piñol, Rafael, et al., Synthesis, Properties, and Polymerization of New Liquid Crystalline Monomers for Highly Ordered Guest-Host Systems, Chem. Matter, 2008, 20, 11 pages.

*Primary Examiner* — Fernando L Toledo
*Assistant Examiner* — Shawn Shaw Muslim
(74) *Attorney, Agent, or Firm* — Womble Bond Dickinson (US) LLP

(57) ABSTRACT

A display apparatus includes: a substrate; a light-emitting element layer on the substrate, the light-emitting element layer including light-emitting elements; an interference layer on the light-emitting element layer; an organic layer on the interference layer and having reverse wavelength dispersion characteristics; and a linear polarization layer on the organic layer.

16 Claims, 7 Drawing Sheets

(56) References Cited

U.S. PATENT DOCUMENTS

| | | | | |
|---|---|---|---|---|
| 2013/0329288 | A1* | 12/2013 | Yim | G02B 5/30 359/483.01 |
| 2017/0226071 | A1* | 8/2017 | Hida | C07C 22/08 |
| 2018/0164620 | A1* | 6/2018 | Kim | G02F 1/134309 |
| 2020/0266382 | A1 | 8/2020 | Seo et al. | |
| 2021/0066665 | A1 | 3/2021 | Kwon et al. | |

FOREIGN PATENT DOCUMENTS

| | | | |
|---|---|---|---|
| KR | 10-1700772 | B1 | 1/2017 |
| KR | 10-2129764 | B1 | 7/2020 |
| KR | 10-2020-0100901 | A | 8/2020 |
| KR | 10-2020-0124804 | A | 11/2020 |
| KR | 10-2020-0138199 | A | 12/2020 |
| KR | 10-2021-0025751 | A | 3/2021 |

* cited by examiner

DISPLAY APPARATUS AND METHOD OF MANUFACTURING THE SAME

CROSS-REFERENCE TO RELATED APPLICATION

This application claims priority to and the benefit of Korean Patent Application No. 10-2021-0079522, filed on Jun. 18, 2021, in the Korean Intellectual Property Office, the entire content of which is hereby incorporated by reference.

BACKGROUND

1. Field

One or more embodiments of the present disclosure relate to a display apparatus and a method of manufacturing the same, and, for example, to a display apparatus having improved performance for reducing the reflectance of external light, and a method of manufacturing the display apparatus.

2. Description of the Related Art

Among display apparatuses, an organic light-emitting display apparatus has wide viewing angles, high contrast, and fast response times. Thus, organic light-emitting display apparatuses have attracted attention as next-generation display apparatuses.

An organic light-emitting display apparatus includes thin-film transistors and organic light-emitting elements above a substrate, and the organic light-emitting elements emit light by themselves. Organic light-emitting display apparatuses may be used as displays for small products such as mobile phones or large products such as televisions.

In such an organic light-emitting display apparatus, a polyvinyl alcohol (PVA)-based polarizing film is introduced in order to prevent or reduce reflection of external light from the front of the organic light-emitting display apparatus.

SUMMARY

However, because an existing polarizing film has a great thickness for heat resistance and moisture resistance due to a strong sublimation property thereof, the existing polarizing film is unsuitable for the slim profile and weight reduction of a display apparatus.

One or more embodiments include a display apparatus having a relatively small thickness and improved performance for reducing the reflectance of external light and a method of manufacturing the display apparatus. However, the foregoing are merely examples, and the scope of the disclosure is not limited thereby.

Additional aspects of embodiments will be set forth in part in the description which follows and, in part, will be apparent from the description, or may be learned by practice of the presented embodiments of the disclosure.

According to one or more embodiments, a display apparatus includes a substrate, a light-emitting element layer on the substrate, the light-emitting element layer including light-emitting elements, an interference layer on the light-emitting element layer, an organic layer on the interference layer and having reverse wavelength dispersion characteristics, and a linear polarization layer on the organic layer.

According to the present embodiment, the linear polarization layer may include a smectic liquid crystal compound and a dichroic dye compound.

According to the present embodiment, the smectic liquid crystal compound may include a smectic A phase.

According to the present embodiment, the smectic liquid crystal compound may include a material having functional groups at both ends of a molecular structure thereof.

According to the present embodiment, the smectic liquid crystal compound may include a material represented by Formula A below:

$$\text{(functional group)}-(X1)n1-\text{(functional group)} \qquad \text{Formula A}$$

wherein, in Formula A, the functional group may be an alkylate group or an acrylate group, X1 may be a substituted or unsubstituted alkyl group, a substituted or unsubstituted benzene, O, or C(=O), and n1 may be an integer from 1 to 50.

According to the present embodiment, the dichroic dye compound may include a compound having at least one azo group.

According to the present embodiment, when light incident from above the interference layer to an upper surface of the interference layer is referred to as incident light and light of the incident light reflected from the upper surface of the interference layer in a direction away from the upper surface of the interference layer is referred to as reflected light, an intensity of the reflected light may be less than an intensity of the incident light.

According to the present embodiment, each of the light-emitting elements may include a first electrode, a second electrode, and an intermediate layer between the first electrode and the second electrode.

According to the present embodiment, the interference layer may include a metal and/or a metal oxide.

According to the present embodiment, a phase of light passing through the organic layer may be delayed by $\lambda/4$.

According to the present embodiment, the organic layer may include a reactive mesogen.

According to the present embodiment, the display apparatus may further include an encapsulation layer on the interference layer, the encapsulation layer including an organic encapsulation layer, wherein the organic encapsulation layer may include the organic layer.

According to one or more embodiments, a method of manufacturing a display apparatus includes forming, on a substrate, a light-emitting element layer including light-emitting elements, forming an interference layer on the light-emitting element layer, forming, on the interference layer, an organic layer having reverse wavelength dispersion characteristics, and forming a linear polarization layer on the organic layer.

According to the present embodiment, the linear polarization layer may include a smectic liquid crystal compound and a dichroic dye compound.

According to the present embodiment, the forming of the linear polarization layer may include coating, on the organic layer, a coating material including the smectic liquid crystal compound and the dichroic dye compound, and curing the coating material.

According to the present embodiment, the smectic liquid crystal compound may include a material having functional groups at both ends of a molecular structure thereof, and the functional groups may be crosslinked to each other in the curing of the coating material.

According to the present embodiment, the smectic liquid crystal compound may include a material represented by Formula A below:

$$\text{(functional group)}-(X1)n1-\text{(functional group)} \qquad \text{Formula A}$$

wherein, in Formula A, the functional group may be an alkylate group or an acrylate group, X1 may be a substituted or unsubstituted alkyl group, a substituted or unsubstituted benzene, O, or C(=O), and n1 may be an integer from 1 to 50.

According to the present embodiment, the smectic liquid crystal compound may include a smectic A phase.

According to the present embodiment, the dichroic dye compound may include a compound having at least one azo group.

According to the present embodiment, a phase of light passing through the organic layer may be delayed by λ/4.

Other aspects and features of embodiments of the disclosure will become better understood through the accompanying drawings, the claims and the detailed description.

Also, these general and/or specific aspects of embodiments may be implemented by using a system, a method, a computer program, or any combination thereof.

BRIEF DESCRIPTION OF THE DRAWINGS

The above and other aspects and features of certain embodiments of the disclosure will be more apparent from the following description taken in conjunction with the accompanying drawings, in which.

DETAILED DESCRIPTION

Figure 1:
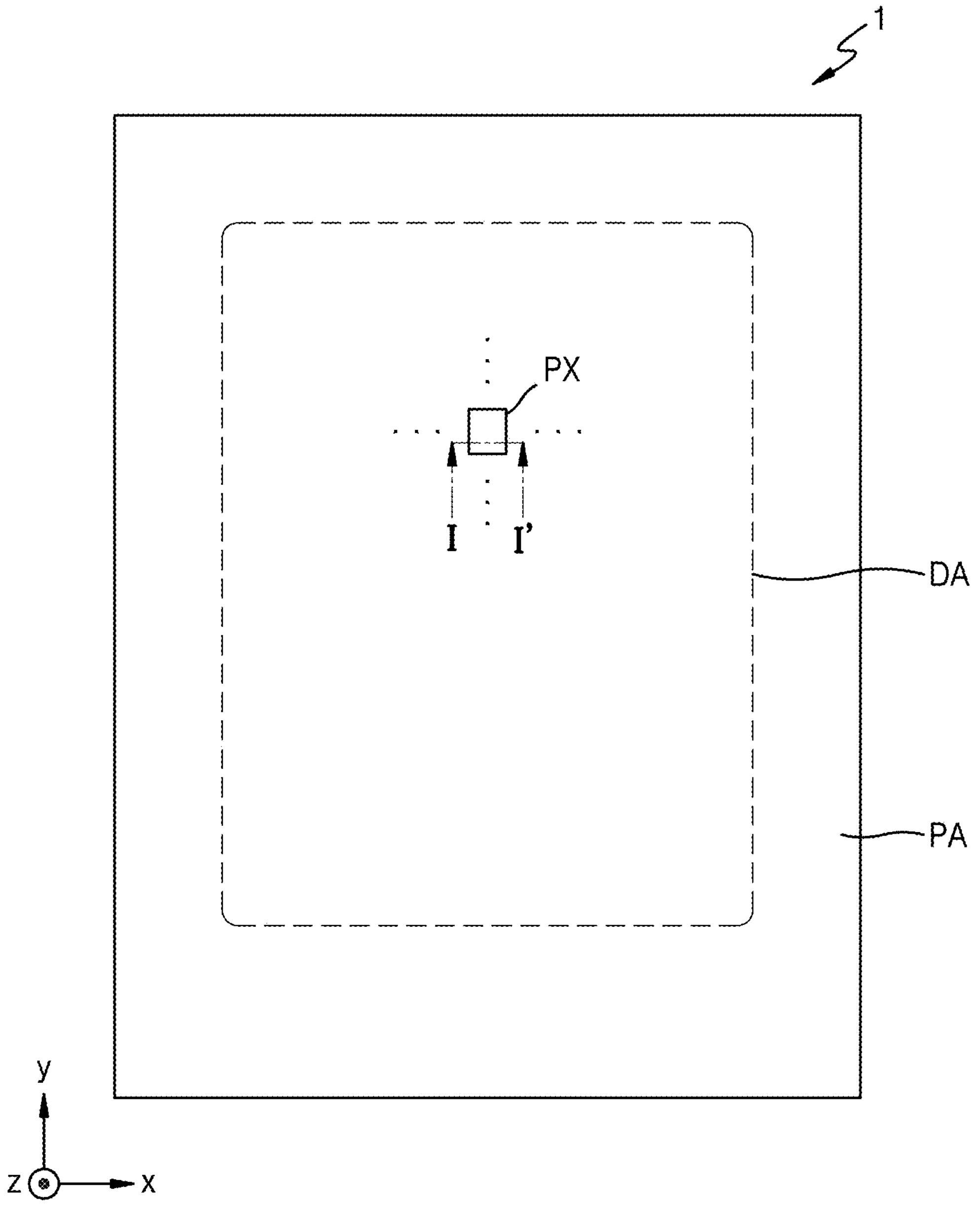
FIG. 1 is a plan view schematically illustrating a portion of a display apparatus, according to an embodiment.

Reference will now be made in more detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, certain embodiments are merely described below, by referring to the figures, to explain aspects of embodiments of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

As the present description allows for various changes and numerous embodiments, certain embodiments will be illustrated in the drawings and described in more detail in the written description. Effects and features of the disclosure, and methods of achieving them will be clarified with reference to embodiments described below in more detail with reference to the drawings. However, the disclosure is not limited to the following embodiments and may be embodied in various forms.

It will be understood that although the terms "first," "second," etc. may be used herein to describe various elements, these elements should not be limited by these terms. These terms are only used to distinguish one element from another.

The singular forms "a," "an," and "the" as used herein are intended to include the plural forms as well unless the context clearly indicates otherwise.

It will be further understood that the terms "comprises" and/or "comprising" used herein specify the presence of stated features or elements, but do not preclude the presence or addition of one or more other features or elements.

It will be further understood that, when a layer, region, or element is referred to as being "on" another layer, region, or element, it can be directly or indirectly on the other layer, region, or element. That is, for example, intervening layers, regions, or elements may be present.

Sizes of elements in the drawings may be exaggerated or reduced for convenience of explanation. For example, because sizes and thicknesses of elements in the drawings may be arbitrarily illustrated for convenience of explanation, the disclosure is not limited thereto.

When a certain embodiment may be implemented differently, a process order may be performed differently from the described order. For example, two consecutively described processes may be performed substantially at the same time or performed in an order opposite to the described order.

In this specification, the expression "A and/or B" indicates only A, only B, or both A and B. The expression "at least one of A and B" indicates only A, only B, or both A and B.

It will be further understood that, when layers, regions, or components are referred to as being connected to each other, they may be directly connected to each other and/or indirectly connected to each other with intervening layers, regions, or components therebetween. For example, when layers, regions, or components are referred to as being electrically connected to each other, they may be directly electrically connected to each other and/or indirectly electrically connected to each other with intervening layers, regions, or components therebetween.

The x-axis, the y-axis, and the z-axis are not limited to three axes of the rectangular coordinate system and may be interpreted in a broader sense. For example, the x-axis, the y-axis, and the z-axis may be perpendicular to one another or may represent different directions that are not perpendicular to one another.

Example embodiments of the disclosure will be described below in more detail with reference to the accompanying drawings. Those elements that are the same or are in correspondence with each other are rendered the same reference numeral regardless of the figure number, and redundant explanations thereof may not be repeated.

FIG. 1 is a plan view schematically illustrating a portion of a display apparatus 1, according to an embodiment.

As illustrated in FIG. 1, the display apparatus 1 according to an embodiment may include a display area DA in which light is emitted and a peripheral area PA in which no light is emitted. A substrate (see 100 of FIG. 2) of the display apparatus 1 may include an area corresponding to the display area DA and an area corresponding to the peripheral area PA.

Although FIG. 1 illustrates the display apparatus 1 having a rectangular display area DA, the disclosure is not limited thereto. For example, the display area DA may have any suitable shape, for example, a circular shape, an elliptical shape, or any suitable polygonal shape.

In the display area DA, pixels PX may be positioned at intersections of scan lines extending in the x-axis direction and data lines extending in the y-axis direction. Each of the pixels PX may include a pixel circuit connected to the scan line and the data line, and a light-emitting element connected to the pixel circuit.

The peripheral area PA may surround at least a portion of the display area DA. For example, the peripheral area PA may completely surround the display area DA. Various suitable lines configured to transmit electric signals to be applied to the display area DA may be positioned in the peripheral area PA. Also, a portion of a circuit configured to control electric signals to be applied to the display area DA may be positioned in the peripheral area PA.

The display apparatus 1 according to an embodiment includes a light-emitting element configured to emit light. The light-emitting element may include an organic light-emitting diode, an inorganic light-emitting diode, a micro light-emitting diode, and/or a quantum dot light-emitting diode. Hereinafter, for convenience of description, a case in which the light-emitting element of the display apparatus 1 includes an organic light-emitting diode will be mainly described. However, the disclosure is not limited to the following description. The disclosure may be equally applied to embodiments in which the display apparatus 1 includes other types or kinds of light-emitting elements.

In some embodiments, the display apparatus 1 may be used as display screens for various suitable products such as not only portable electronic apparatuses, such as mobile phones, smart phones, tablet personal computers (PCs), mobile communication terminals, electronic organizers, e-books, portable multimedia players (PMPs), navigations, and/or ultra mobile PCs (UMPCs), but also televisions, laptops, monitors, billboards, and/or internet of things (IoT) apparatuses. Also, the display apparatus 1 according to an embodiment may also be used in wearable devices, such as, for example, smart watches, watch phones, glasses-type displays, and/or head mounted displays (HMDs). The display apparatus 1 according to an embodiment may also be used in dashboards of automobiles, center information displays (CIDs) of the center fascia and/or dashboards of automobiles, room mirror displays that replace the side mirrors of automobiles, and/or display screens arranged on the rear sides of front seats as entertainment devices for backseat passengers of automobiles.

Figure 2:
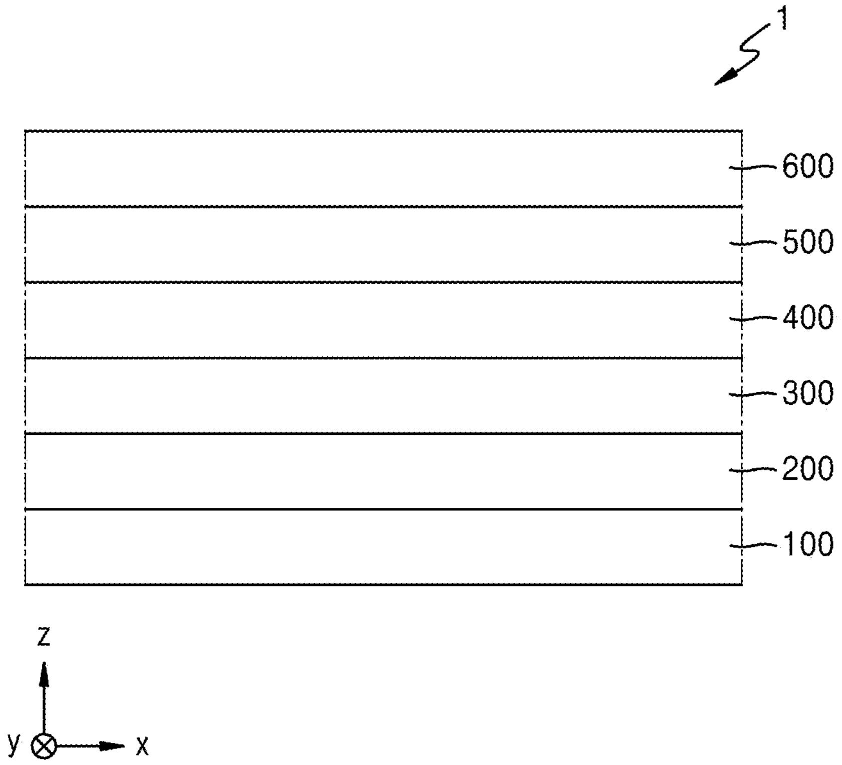
FIG. 2 is a side view schematically illustrating a portion of the display apparatus, according to an embodiment.
Figure 3:
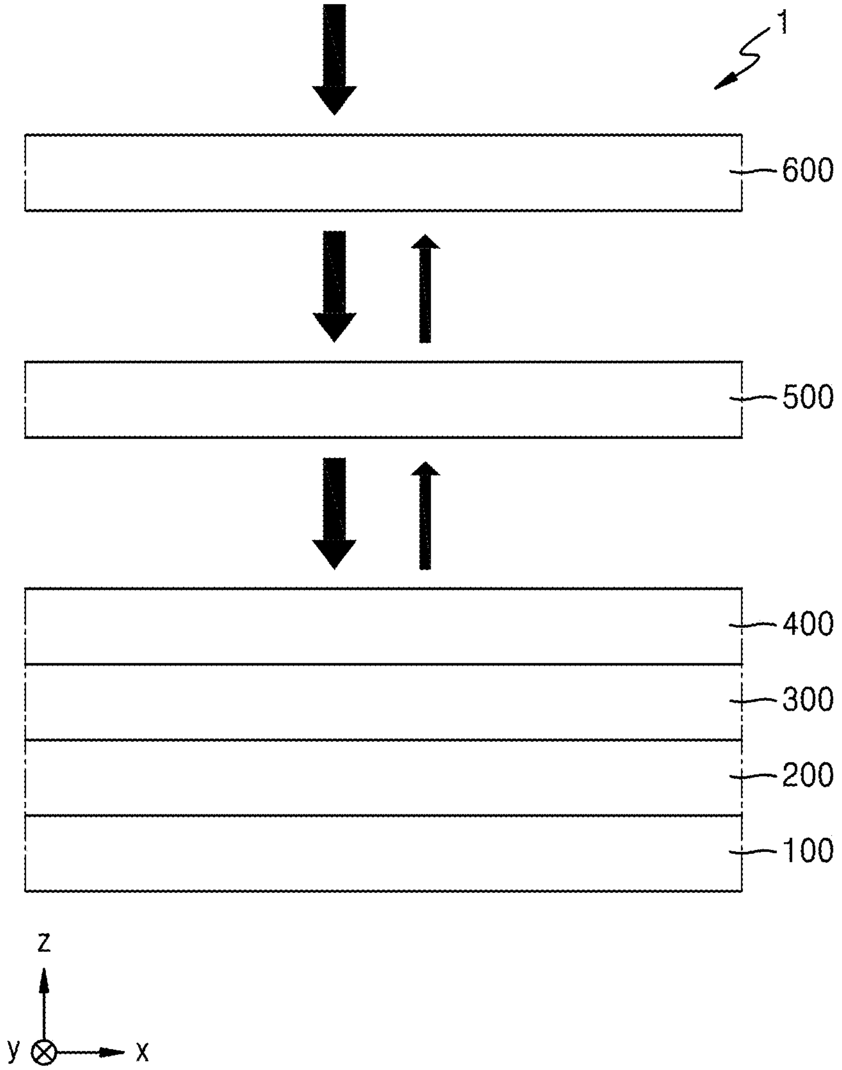
FIG. 3 is a conceptual diagram illustrating a process of preventing or reducing the reflection of external light in a display apparatus, according to an embodiment.
Figure 4:
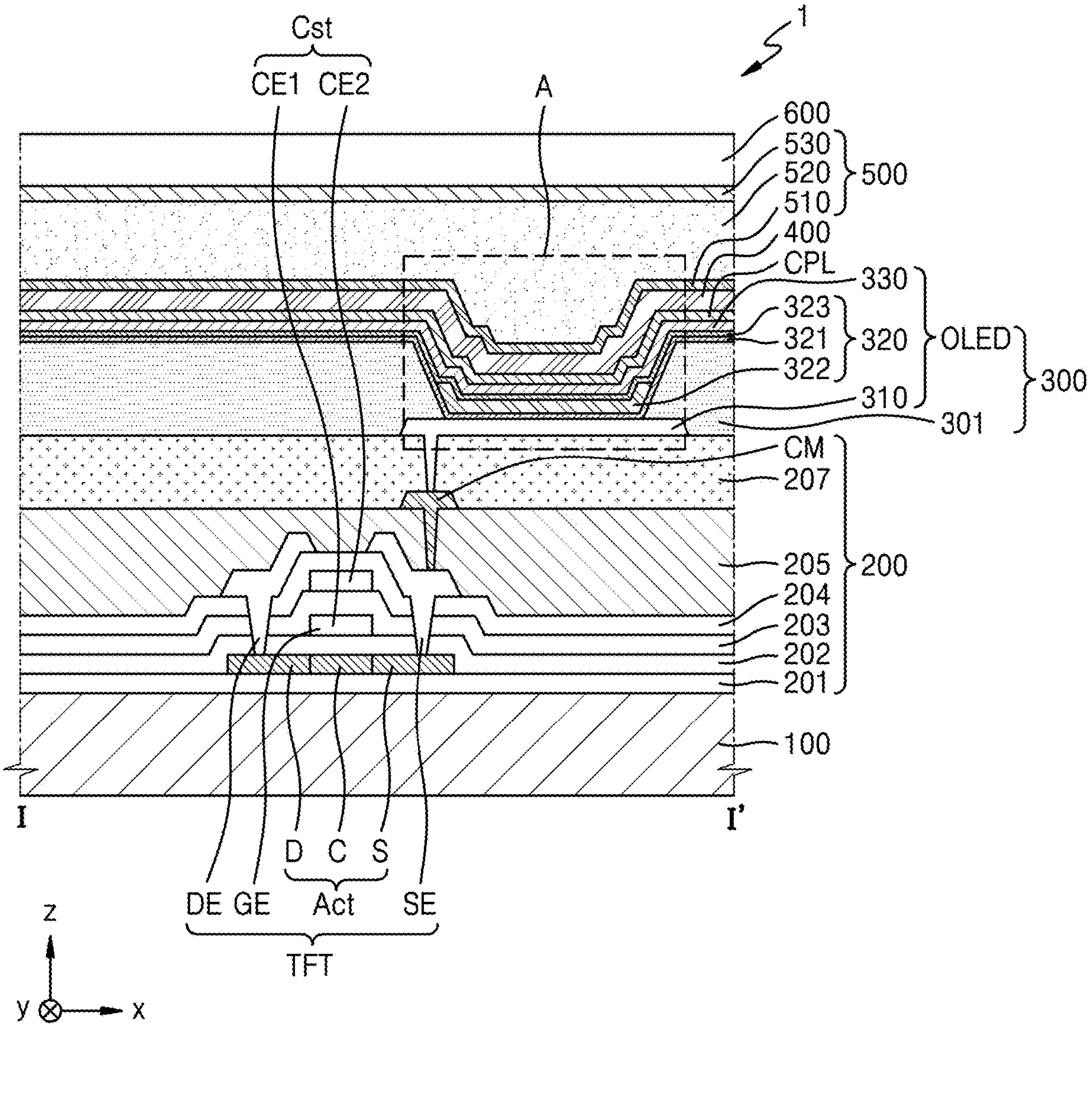
FIG. 4 is a cross-sectional view schematically illustrating a portion of a display apparatus, according to an embodiment.

FIG. 2 is a side view schematically illustrating a portion of the display apparatus 1, according to an embodiment, FIG. 3 is a conceptual diagram for describing a process of preventing or reducing the reflection of external light in the display apparatus 1, according to an embodiment, and FIG. 4 is a cross-sectional view schematically illustrating a portion of the display apparatus 1, according to an embodiment.

As illustrated in FIGS. 2 to 4, the display apparatus 1 according to an embodiment may include a substrate 100, and may include a circuit layer 200, a light-emitting element layer 300, an interference layer 400, an encapsulation layer 500, and a linear polarization layer 600, which are sequentially stacked on the substrate 100.

The substrate 100 may include various suitable materials such as glass, metal, and/or an organic material. In an optional embodiment, the substrate 100 may include a flexible material. For example, the substrate 100 may include ultra-thin flexible glass (e.g., a thickness of several tens to several hundred μm) and/or a polymer resin. When the substrate 100 includes a polymer resin, the substrate 100 may include polyimide. In some embodiments, the substrate 100 may include polyethersulfone, polyarylate, polyetherimide, polyethylene naphthalate, polyethylene terephthalate (PET), polyphenylene sulfide, polycarbonate, cellulose triacetate, and/or cellulose acetate propionate.

The circuit layer 200 including pixel circuits and the light-emitting element layer 300 including light-emitting elements may be on the substrate 100. The light-emitting elements of the light-emitting element layer 300 may be electrically connected to the pixel circuits of the circuit layer 200. Each of the pixel circuits of the circuit layer 200 includes at least one thin-film transistor. When the light-emitting element is electrically connected to the pixel circuit, it may be understood that the light-emitting element is electrically connected to the thin-film transistor of the pixel circuit.

In an embodiment, as illustrated in FIG. 4, a buffer layer 201 may be on the substrate 100. The buffer layer 201 may reduce or prevent infiltration of foreign material, moisture, and/or ambient air from below the substrate 100 and may increase the smoothness of the upper surface of the substrate 100. The buffer layer 201 may include an inorganic insulating material such as silicon oxide, silicon oxynitride, and/or silicon nitride, and may have a single layer structure or a multilayer structure including the above-described material. A barrier layer that prevents or reduces infiltration of ambient air may be further included between the substrate 100 and the buffer layer 201. In another embodiment, the buffer layer 201 may be omitted.

A thin-film transistor TFT may be on the buffer layer 201. The thin-film transistor TFT may include a semiconductor layer Act, a gate electrode GE, a source electrode SE, and a drain electrode DE. In the present embodiment, a top gate type or kind in which the gate electrode GE is on the semiconductor layer Act with a first gate insulating layer 202 therebetween is illustrated, but the disclosure is not limited thereto. For example, the thin-film transistor TFT may be a bottom gate type or kind.

The semiconductor layer Act may be on the buffer layer 201. The semiconductor layer Act may include a channel region C, and a source region S and a drain region D doped with impurities on both sides of the channel region C. The semiconductor layer Act may include amorphous silicon or polysilicon. As an example, the semiconductor layer Act may include an oxide of at least one material selected from indium (In), gallium (Ga), stannum or tin (Sn), zirconium (Zr), vanadium (V), hafnium (Hf), cadmium (Cd), germanium (Ge), chromium (Cr), titanium (Ti), aluminum (Al), cesium (Cs), cerium (Ce), and zinc (Zn). Also, the semiconductor layer Act may include a Zn oxide-based material, for example, Zn oxide, In—Zn oxide, and Ga—In—Zn oxide. Also, the semiconductor layer Act may include In—Ga—Zn—O (IGZO), In—Sn—Zn—O (ITZO), or In—Ga—Sn—Zn—O (IGTZO) semiconductor, in which a metal such as indium (In), gallium (Ga), and stannum (Sn) is included in ZnO.

The gate electrode GE is on the semiconductor layer Act so as to overlap at least a portion of the semiconductor layer Act. For example, the gate electrode GE may overlap the channel region of the semiconductor layer Act. The gate electrode GE may include various suitable conductive materials including molybdenum (Mo), aluminum (Al), copper (Cu), titanium (Ti), and/or the like, and may have various suitable layer structures. For example, the gate electrode GE may include a Mo layer and an Al layer, or may have a three-layer structure of Mo/Al/Mo.

The first gate insulating layer 202 may be between the semiconductor layer Act and the gate electrode GE. Also, a second gate insulating layer 203 may be arranged to cover the gate electrode GE. The first gate insulating layer 202 and the second gate insulating layer 203 may include an inorganic insulating material such as silicon oxide, silicon nitride, silicon oxynitride, aluminum oxide, titanium oxide, tantalum oxide, and/or hafnium oxide, and may include a single layer or multiple layers including the above-described inorganic insulating material.

An upper electrode CE2 of a storage capacitor Cst may be on the second gate insulating layer 203. The upper electrode CE2 may overlap the gate electrode GE. Therefore, the gate electrode GE overlapping the upper electrode CE2 with the second gate insulating layer 203 therebetween may function as a lower electrode CE1 of the storage capacitor Cst. The upper electrode CE2 may include aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and/or copper (Cu), and may include a single layer or multiple layers including the above-described material.

An interlayer insulating layer 204 may be arranged to cover the upper electrode CE2. The interlayer insulating layer 204 may include an inorganic insulating material such as silicon oxide, silicon nitride, silicon oxynitride, aluminum oxide, titanium oxide, tantalum oxide, and/or hafnium oxide, and may include a single layer or multiple layers including the above-described inorganic insulating material.

The source electrode SE and the drain electrode DE may be on the interlayer insulating layer 204. The source electrode SE and the drain electrode DE may be connected to the source region S and the drain region D of the semiconductor layer Act through contact holes. The source electrode SE and the drain electrode DE may include various suitable conductive materials including molybdenum (Mo), aluminum (Al), copper (Cu), titanium (Ti), and/or the like, and may have various suitable layer structures. For example, the source electrode SE and the drain electrode DE may include a Ti layer and an Al layer, or may have a three-layer structure of Ti/Al/Ti.

The thin-film transistor TFT may be covered with a first organic insulating layer 205. For example, the first organic insulating layer 205 may cover the source electrode SE and the drain electrode DE. The first organic insulating layer 205 is a planarization insulating layer and may include a substantially flat upper surface. Also, a second organic insulating layer 207 may be on the first organic insulating layer 205. The first organic insulating layer 205 and the second organic insulating layer 207 may include an organic insulating material such as a general-purpose polymer (e.g., polymethylmethacrylate (PMMA) and/or polystyrene (PS)), a polymer derivative having a phenol-based group, an acrylic polymer, an imide-based polymer, an aryl ether-based polymer, an amide-based polymer, a fluorine-based polymer, a p-xylene-based polymer, a vinyl alcohol-based polymer, and/or any blend thereof.

The light-emitting element layer 300 may be on the circuit layer 200 having the above-described structure. As an example of the light-emitting element layer 300, an organic light-emitting diode OLED may be included. The organic light-emitting diode OLED may include a first electrode 310, a second electrode 330, and an intermediate layer 320 therebetween.

The first electrode 310 may be on the second organic insulating layer 207. The first electrode 310 may include a conductive oxide such as indium tin oxide (ITO), indium zinc oxide (IZO), zinc oxide (ZnO), indium oxide ($In_2O_3$), indium gallium oxide (IGO), and/or aluminum zinc oxide (AZO). According to another embodiment, the first electrode 310 may include a reflective layer including silver (Ag), magnesium (Mg), aluminum (Al), platinum (Pt), palladium (Pd), gold (Au), nickel (Ni), neodymium (Nd), Iridium (Ir), chromium (Cr), and/or any compound thereof. According to another embodiment, the first electrode 310 may further include a layer including ITO, IZO, ZnO, and/or $In_2O_3$ above/below the reflective layer.

In an embodiment, the first electrode 310 may be electrically connected to the thin-film transistor TFT through a connection electrode CM positioned on the first organic insulating layer 205. For example, the connection electrode CM may be between the first organic insulating layer 205 and the second organic insulating layer 207. The connection electrode CM may include a conductive material including molybdenum (Mo), aluminum (Al), copper (Cu), titanium (Ti), and/or the like, and may include a single layer or multiple layers including the above-described material. In another embodiment, the connection electrode CM may be omitted.

A pixel defining layer 301 may be on the first electrode 310. The pixel defining layer 301 may include a pixel opening exposing the upper surface of the first electrode 310, and may cover the edge of the first electrode 310. In this manner, the pixel defining layer 301 may define the emission area of the pixel. The pixel defining layer 301 may include an organic insulating material. In some embodiments, the pixel defining layer 301 may include an inorganic insulating material such as silicon nitride, silicon oxynitride, and/or silicon oxide. In some embodiment, the pixel defining layer 301 may include an organic insulating material and/or an inorganic insulating material. In an embodiment, the pixel defining layer 301 may include a light blocking material, which may be black. The light blocking material may include carbon black, carbon nanotubes, a resin and/or a paste including a black dye, metal particles, for example, nickel (Ni), aluminum (Al), molybdenum (Mo) and/or any alloy thereof, metal oxide particles (e.g., chromium oxide, etc.) and/or metal nitride particles (e.g., chromium nitride, etc.). When the pixel defining layer 301 includes a light blocking material, the pixel defining layer 301 may reduce a phenomenon of external light incident into the display apparatus 1 being reflected by metal structures under the pixel defining layer 301 and being emitted to the outside.

The intermediate layer 320 may include an emission layer 322. In an embodiment, the emission layer 322 may include an organic material. The emission layer 322 may include a high molecular weight organic material or a low molecular weight organic material that emits light of a set or certain color. The intermediate layer 320 may include a first common layer 321 below the emission layer 322 and/or a second common layer 323 above the emission layer 322.

The first common layer 321 may include a single layer or multiple layers. For example, when the first common layer 321 includes a high molecular weight material, the first common layer 321 may be a hole transport layer having a single layer structure and may include, for example, poly-(3,4)-ethylene-dihydroxy thiophene (PEDOT) and/or polyaniline (PANI). When the first common layer 321 includes a low molecular weight material, the first common layer 321 may include a hole injection layer and a hole transport layer.

The second common layer 323 may be optional. For example, when the first common layer 321 and the emission layer 322 include a high molecular weight material, the second common layer 323 may be formed. The second common layer 323 may include a single layer or multiple layers. The second common layer 323 may include an electron transport layer and/or an electron injection layer.

The emission layer 322 included in the intermediate layer 320 may be arranged in each of the pixels (see PX of FIG. 1) in the display area (see DA of FIG. 1). The emission layer 322 may be arranged to overlap the pixel opening of the pixel defining layer 301 and/or the first electrode 310. Each of the first common layer 321 and the second common layer 323 of the intermediate layer 320 may be formed as a single body (e.g., a sole body or a unitary body) over the pixels PX.

The second electrode 330 may include a conductive material (e.g., an electrically conductive material) having a low work function. For example, the second electrode 330 may include a (semi)transparent layer including silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), and/or any alloy thereof. In some embodiments, the second electrode 330 may further include a layer such as ITO, IZO, ZnO, and/or $In_2O_3$ on the (semi)transparent layer including the above-described material. The second electrode 330 is a single body (e.g., a sole body or a unitary body) and may cover a plurality of first electrodes 310 in the display area DA. The intermediate layer 320 and the second electrode 330 may be formed by thermal evaporation.

In an embodiment, a capping layer CPL may be on the second electrode 330. The capping layer CPL may include LiF, an inorganic material, and/or an organic material. In another embodiment, the capping layer CPL may be omitted.

Because the organic light-emitting diode OLED may be easily damaged by external moisture and/or oxygen, the organic light-emitting diode OLED may be covered and protected by the encapsulation layer 500.

Layers serving to reduce the reflectance of external light may be on the above-described light-emitting element layer 300. Here, the "external light" refers to light introduced from the outside of the display apparatus 1 rather than the inside of the display apparatus 1. Such external light may be incident into the display apparatus 1 and reflected to the outside by the layers provided in the display apparatus 1, and the reflected light may be visually recognized from the outside and cause display quality and visibility to be deteriorated. In order to prevent or reduce such a limitation, the display apparatus 1 according to an embodiment may include the interference layer 400, the encapsulation layer 500, and the linear polarization layer 600, which are sequentially on the light-emitting element layer 300.

Referring to FIG. 3, the external light incident from above the display apparatus 1 passes through the linear polarization layer 600 and is linearly polarized, and the external light passes through the encapsulation layer 500 and is circularly polarized. Then, the external light is introduced into the display apparatus 1. At least a portion of the light introduced into the display apparatus 1 is absorbed and/or extinguished by the interference layer 400. The light reflected toward the outside without being absorbed and/or extinguished by the interference layer 400 may pass through the encapsulation layer 500 again and may be circularly polarized, and the light may be blocked by the linear polarization layer 600 (or have its intensity reduced). Therefore, there is an effect of blocking or reducing the reflectance of external light.

The interference layer 400 may be on the light-emitting element layer 300. In contrast to the intensity of the incident light incident from the outside to the inside, the incident light is reflected and may serve to reduce the intensity of the reflected light directed to the outside (or block reflection of the light to the outside). For example, when the light incident from above the interference layer 400 to the upper surface of the interference layer 400 is referred to as incident light and light of the light directed reflected from the upper surface of the interference layer 400 in a direction away from the upper surface of the interference layer 400 is referred to as reflected light, the intensity of the reflected light may be less than the intensity of the incident light.

The interference layer 400 may induce destructive interference between light reflected from the upper surface of the interference layer 400 and light reflected from the upper surface of the layer (e.g., the first electrode 310, the second electrode 330, etc.) under the interference layer 400. This effect will be described in more detail with reference to FIG. 5.

Figure 5:
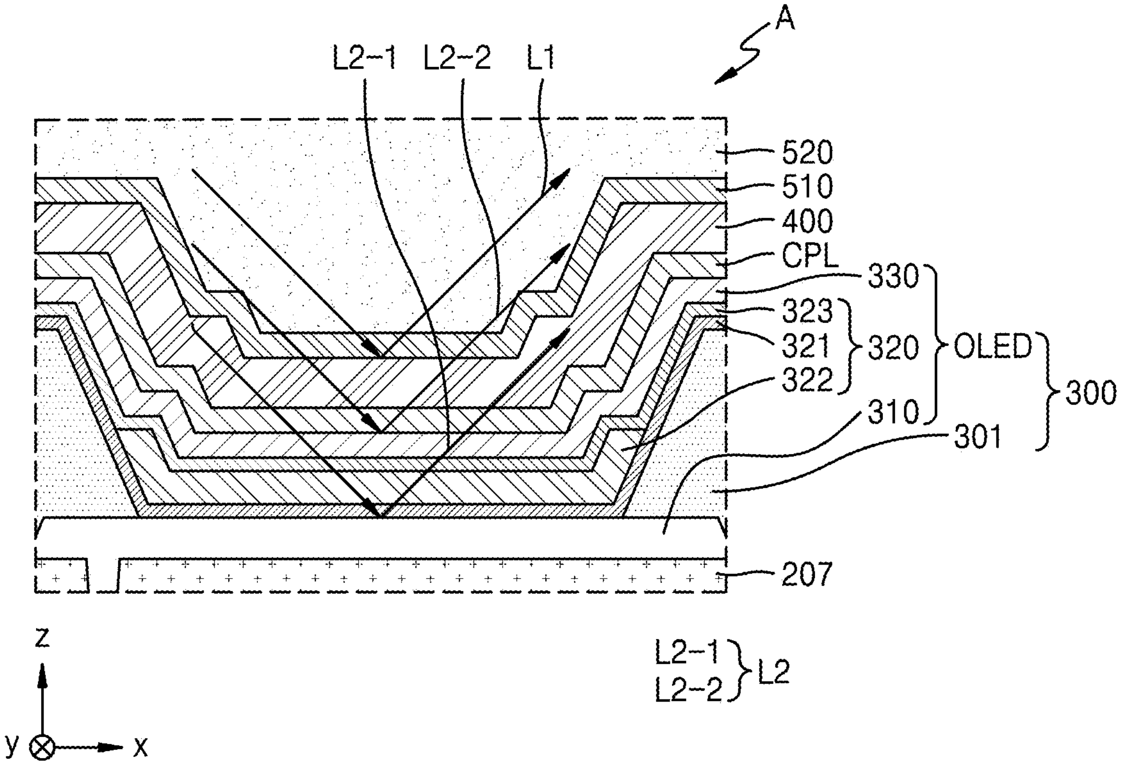
FIG. 5 is a cross-sectional view illustrating a function of an interference layer according to an embodiment and is an enlarged view of region A of FIG. 4.

FIG. 5 is a cross-sectional view for describing the function of the interference layer 400 according to an embodiment and is an enlarged view of region A of FIG. 4.

As illustrated in FIG. 5, incident light incident from the upper portion of the interference layer 400 in a direction of the upper surface of the interference layer 400 may be reflected from the upper surface of the interference layer 400 and/or the upper surface of the layer under the interference layer 400. In this embodiment, the reflected light reflected from the upper surface of the interference layer 400 and the reflected light reflected from the upper surface of the layer under the interference layer 400 may destructively interfere with each other. Through such destructive interference, the interference layer 400 may absorb, remove, or extinguish at least a portion of the incident light so that the intensity of the reflected light is relatively less than the intensity of the incident light.

In some embodiments, the reflected light may include first reflected light L1 obtained when a portion of the incident light is reflected from the upper surface of the interference layer 400, and second reflected light L2 obtained when the remaining portion of the incident light is reflected from the upper surface of the layer under the interference layer 400. In an embodiment, the layer under the interference layer 400 may be the first electrode 310 and/or the second electrode 330, but the disclosure is not limited thereto. For example, the layer under the interference layer 400 may include any suitable layer that is arranged under the interference layer 400 and includes a material (e.g., a metal and/or an electrode) that reflects light.

Referring to FIG. 5, at least a portion of the first reflected light L1 obtained when the incident light is reflected from the upper surface of the interference layer 400 may be extinguished by destructive interference with (2-1)th reflected light L2-1 reflected from the upper surface of the first electrode 310 and/or (2-2)th reflected light L2-2 obtained when the incident light is reflected from the upper surface of the second electrode 330.

The interference layer 400 may include a metal and/or a metal oxide. For example, the interference layer 400 may include aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), iron (Fe), copper (Cu), bismuth (Bi), ytterbium (Yb), cobalt (Co), gadolinium (Gd), zirconium (Zr), silicon (Si), hafnium (Hf), niobium (Nb), yttrium (Y), tantalum (Ta), gallium (Ga), germanium (Ge), antimony (Sb), manganese (Mn), lead (Pb), tellurium (Te), zinc (Zn), stannum (Sn), and/or indium (In). In some embodiments, the interference layer 400 may include $MoO_2$, $MoO_3$, $Ta_2O_5$, $Nb_2O_5$, $SnO_2$, $ZrO_2$, $HfO_2$, $Fe_2O_3$, ZnO, $WO_3$, and/or ITO.

An organic layer capable of acting as a retarder due to having reverse wavelength dispersion characteristics may be on the interference layer 400. As used herein, the phrase "reverse wavelength dispersion characteristics," which is further described herein below, relates to the dependence of the phase retardation value on the wavelength, and refers to characteristics in which the magnitude of birefringence increases as the wavelength increases.

In an embodiment, the organic layer on the interference layer 400 may be provided as a portion of the encapsulation layer 500 to be further described herein below. For example, the organic layer may be an organic encapsulation layer 520 included in the encapsulation layer 500, but the disclosure is not limited thereto. Also, the organic layer may include one or more materials selected from polyacrylate, polyethylene terephthalate, polyethylene naphthalate, polycarbonate, polyimide, polyethylene sulfonate, polyoxymethylene, polyarylate, and hexamethyldisiloxane.

Referring back to FIG. 4, the encapsulation layer 500 may be on the interference layer 400. The encapsulation layer 500 may include at least one organic encapsulation layer. In this regard, FIG. 4 illustrates a case in which the encapsulation layer 500 includes a first inorganic encapsulation layer 510, an organic encapsulation layer 520, and a second inorganic encapsulation layer 530, but the disclosure is not limited thereto.

The first inorganic encapsulation layer 510 may cover the second electrode 330 and may include an inorganic insulating material such as silicon oxide, silicon oxynitride, and/or silicon nitride. Other layers may be between the first inorganic encapsulation layer 510 and the second electrode 330. Because the first inorganic encapsulation layer 510 is formed along the structure thereunder, the upper surface of the first inorganic encapsulation layer 510 is not flat. Therefore, the organic encapsulation layer 520 may be formed to cover the first inorganic encapsulation layer 510 so that the upper surface of the first inorganic encapsulation layer 510 is flat (or substantially flat).

The organic encapsulation layer 520 may include one or more materials selected from polyacrylate, polyethylene terephthalate, polyethylene naphthalate, polycarbonate, polyimide, polyethylene sulfonate, polyoxymethylene, polyarylate, and hexamethyldisiloxane. The second inorganic encapsulation layer 530 may cover the organic encapsulation layer 520 and may include an inorganic insulating material such as silicon oxide, silicon oxynitride, and/or silicon nitride. The organic encapsulation layer 520 may be formed by applying a monomer having flowability and then curing a monomer layer using light such as heat and/or ultraviolet rays. In some embodiments, the organic encapsulation layer 520 may be formed by applying the above-described polymer-based material.

On the other hand, the organic encapsulation layer 520 of the encapsulation layer 500 may act as a retarder. In an embodiment, the organic encapsulation layer 520 of the encapsulation layer 500 may include an organic layer that has reverse wavelength dispersion characteristics and acts as a retarder. As used herein, the phrase "reverse wavelength dispersion characteristics" relates to the dependence of the phase retardation value on the wavelength, and refers to characteristics in which the magnitude of birefringence increases as the wavelength increases. This will be described in more detail with reference to FIG. 6.

Figure 6:
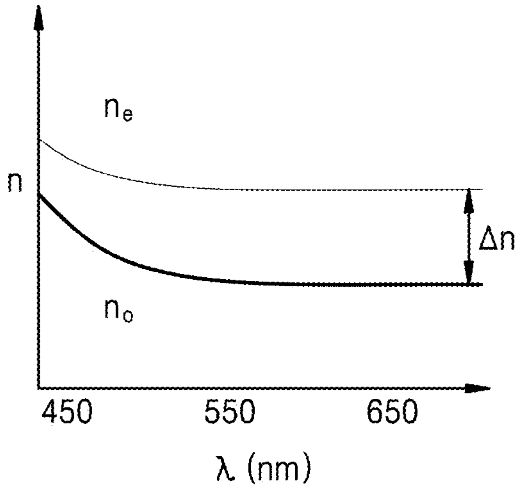
FIG. 6 is a graph illustrating reverse wavelength dispersion characteristics of an organic encapsulation layer, according to an embodiment.

FIG. 6 is a graph illustrating reverse wavelength dispersion characteristics of an organic encapsulation layer, according to an embodiment.

In FIG. 6, no refers to a refractive index in a direction having a constant speed regardless of a traveling direction of light, and ne refers to a refractive index in a direction having a different speed depending on a traveling direction of light. Also, Δn refers to a birefringence and is defined as the difference between ne and no as expressed in Equation 1 below.

$$\text{Birefringence}(\Delta n)=n_e-n_o \qquad \text{Equation 1}$$

Referring to FIG. 6, it may be confirmed that the birefringence Δn of the organic encapsulation layer increases as the wavelength increases. For example, because the organic encapsulation layer has reverse wavelength dispersion characteristics, the organic encapsulation layer may act as a retarder.

In an embodiment, the organic encapsulation layer 520 of the encapsulation layer 500 may delay the phase of light passing through the organic encapsulation layer 520 by λ/4 (by a quarter wavelength) to circularly polarize the light. For example, when the linear polarization layer 600 linearly polarizes light by 90°, external light is circularly polarized by 135° while passing through the linear polarization layer 600 and passing through the organic encapsulation layer 520 from the upper portion to the lower portion of the organic encapsulation layer 520 in a 90° linearly polarized state. In addition, the 135° circularly polarized light may be reflected from the upper surfaces of the underlying layers (e.g., the first electrode 310, the second electrode 330, etc.) and may be circularly polarized by 180° while passing through the encapsulation layer 520 again from the lower portion to the upper portion of the organic encapsulation layer 520. Because the 180° circularly polarized light does not pass through (or substantially does not pass through) the linear polarization layer 600 and is blocked or reduced by the linear polarization layer 600, reflection to the outside of external light incident into the display apparatus 1 may be prevented or reduced.

The organic encapsulation layer 520 of the encapsulation layer 500 may include a reactive mesogen.

Referring back to FIG. 4, the linear polarization layer 600 serves to linearly polarize light passing through the linear polarization layer 600 into light in the same direction as a polarization axis. For example, the linear polarization layer 600 may linearly polarize the incident light incident from above the linear polarization layer 600 when the incident light passes through the linear polarization layer 600. In some embodiments, the linear polarization layer 600 may block (or reduce an intensity of) light in a direction different from the polarization axis of the reflected light directed toward the outside when the incident light is reflected from the inside of the display apparatus 1 to the outside.

The linear polarization layer 600 may include a smectic liquid crystal compound and a dichroic dye compound. For example, the linear polarization layer 600 may be a guest-host type or kind in which a smectic liquid crystal compound is a host and a dichroic dye compound is a guest. The smectic liquid crystal compound serving as the host may include a material having a high order parameter, and the dichroic dye compound serving as the guest may be aligned in a set or specific direction according to the alignment of the host. Therefore, the linear polarization layer 600 may be configured to linearly polarize light passing through the linear polarization layer 600.

In an embodiment, the smectic liquid crystal compound included in the linear polarization layer 600 may have a smectic A phase and/or a smectic B phase. For example, the smectic liquid crystal compound included in the linear polarization layer 600 may include the smectic A phase and/or the smectic B phase.

In the case of the smectic B phase, a high order parameter may be secured as compared with the smectic A phase, which is beneficial in inducing the complete (or substantially complete) alignment of the dichroic dye compound. However, a material having the smectic B phase is relatively limited and it is difficult to induce alignment. In this regard, the display apparatus 1 according to an embodiment includes the interference layer 400 that absorbs or extinguishes at least a portion of the incident light. Therefore, even when the smectic liquid crystal compound includes the smectic A phase, the performance of reducing the reflectance of external light when the smectic liquid crystal compound includes the smectic B phase may be equivalent or better.

The smectic liquid crystal compound included in the linear polarization layer 600 is a linear compound and may include a material having functional groups at both ends of a molecular structure thereof. For example, the smectic liquid crystal compound may be selected from compounds represented by Formula A below.

(functional group)-$(X1)n1$-(functional group),  Formula A

Wherein, in Formula A, the functional group is an alkylate group or an acrylate group, X1 is a substituted or unsubstituted alkyl group, a substituted or unsubstituted benzene, O, or C(═O), and n1 is an integer from 1 to 50.

The smectic liquid crystal compound is not limited to the compound represented by Formula A. For example, in Formula A, the type or kind of the functional group, the type or kind of X1, and the range of n1 may be variously modified. In embodiments, the smectic liquid crystal compound is a linear compound and has functional groups at both ends of a molecular structure thereof, and the functional groups included in the smectic liquid crystal compound may be crosslinked and fixed through photocuring and/or thermal curing in a process of forming the linear polarization layer, which will be further described herein below. This will be described in more detail with reference to FIG. 7.

In an embodiment, the dichroic dye compound included in the linear polarization layer 600 may include a material having at least one azo group. The dichroic dye compound may include any suitable material having dichroism, for example, a property of having high absorbance (e.g., high light absorbance) in a broad wavelength in a long-axis direction of a molecule and a low absorbance (e.g., low light absorbance) in a short-axis direction of the molecule. For example, the dichroic dye compound may be any one of the following compounds represented by Formula B-1 to Formula B-12, but the disclosure is not limited thereto.

Formula B-1

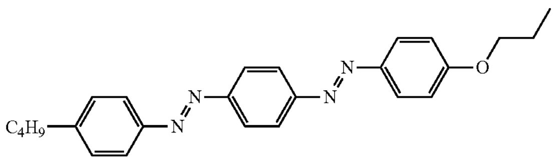

Formula B-2

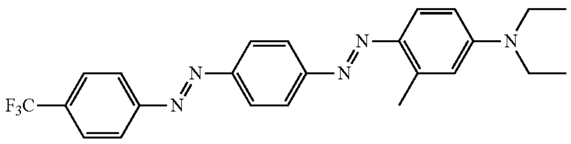

Formula B-3

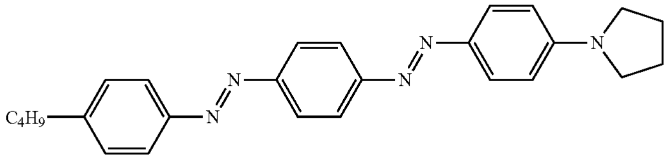

Formula B-4

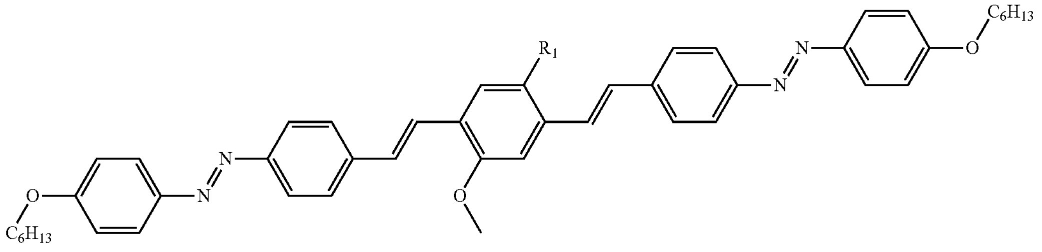

Formula B-5

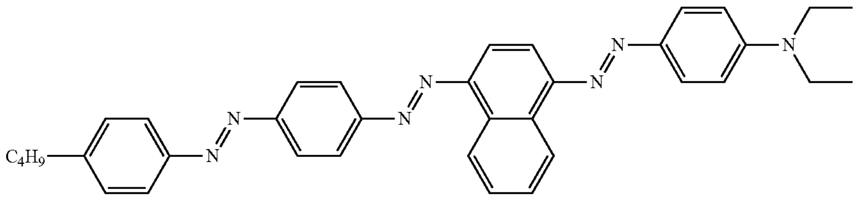

-continued

Formula B-6

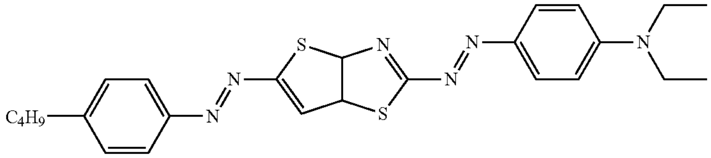

Formula B-7

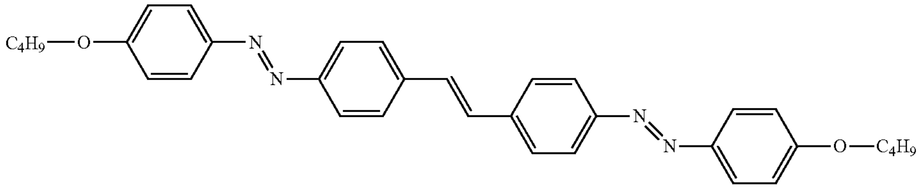

Formula B-8

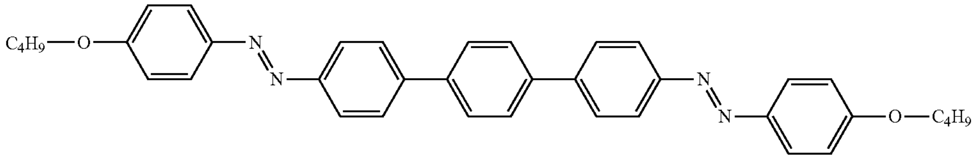

Formula B-9

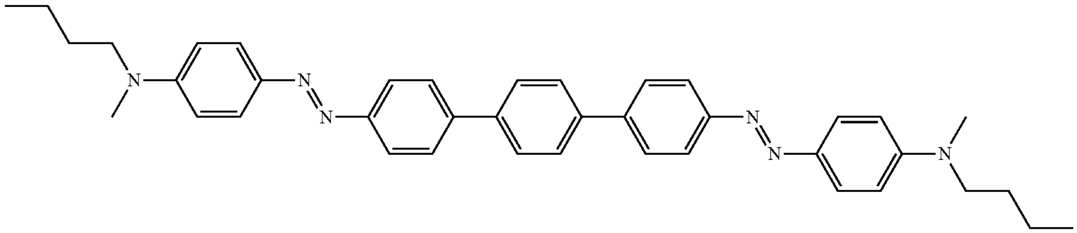

Formula B-10

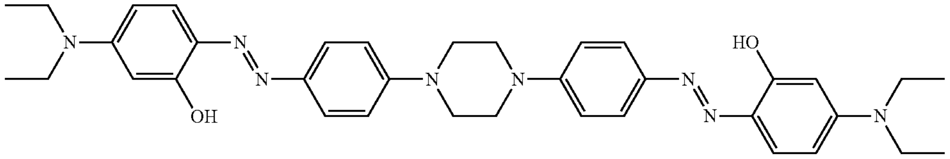

Formula B-11

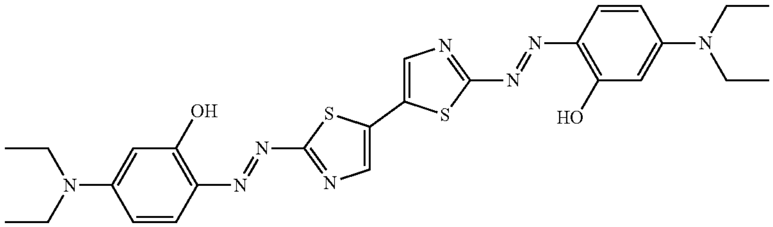

Formula B-12

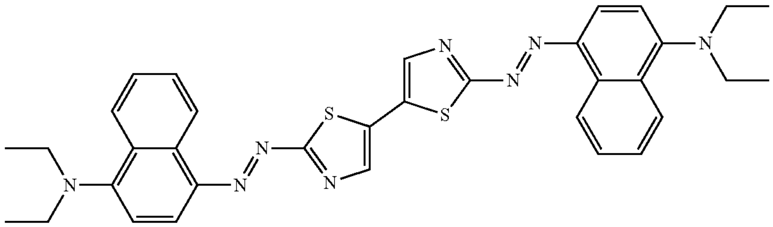

As represented in Formulae B-1 to B-12, the dichroic dye compound included in the linear polarization layer 600 may include one or more azo groups, and the number and position of azo groups in the molecule are not limited.

On the other hand, the amount of the dichroic dye compound included in the linear polarization layer 600 may be controlled to satisfy a preset range. For example, the amount of the dichroic dye compound included in the linear polarization layer 600 may be 10 wt % or less based on the total weight of the linear polarization layer 600.

Figure 7:
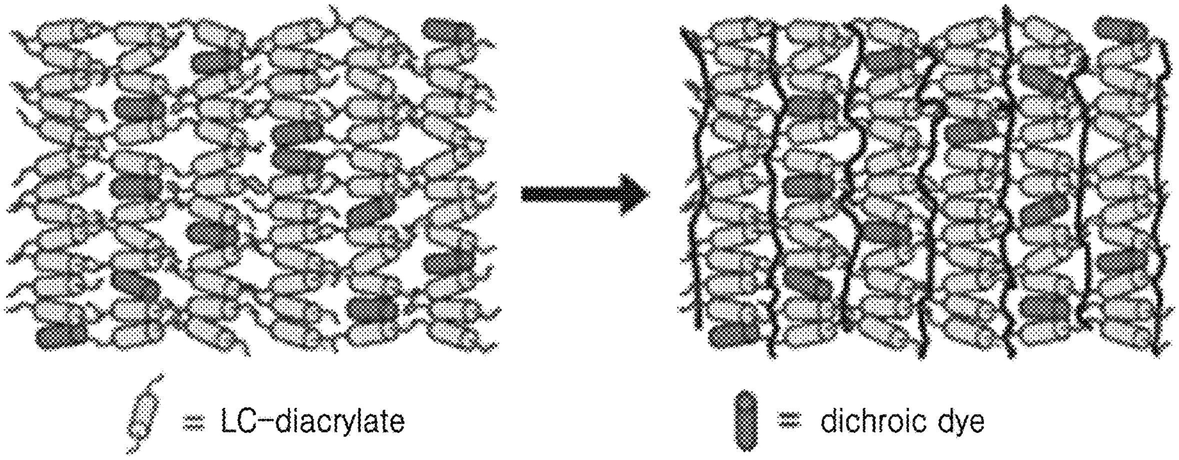
FIG. 7 is an image schematically illustrating a portion of a process of forming a linear polarization layer, according to an embodiment.

FIG. 7 is an image schematically illustrating a portion of a process of forming a linear polarization layer, according to an embodiment.

A method of manufacturing a display apparatus, according to an embodiment, may include: forming, on a substrate, a light-emitting element layer including light-emitting elements; forming an interference layer on the light-emitting element layer; forming, on the interference layer, an encapsulation layer including an organic encapsulation layer having reverse wavelength dispersion characteristics; and forming, on the encapsulation layer, a linear polarization layer including a smectic liquid crystal compound and a dichroic dye compound.

In an embodiment, in the forming of the interference layer, the interference layer may be formed by thermal evaporation. In some embodiments, in the forming of the encapsulation layer, an inorganic encapsulation layer included in the encapsulation layer may be formed by thermal evaporation, and the organic encapsulation layer may be formed by a coating process such as spin coating, slit coating, and/or inkjet coating. In some embodiments, the linear polarization layer may be formed by a coating process such as spin coating, bar coating, slit coating, and/or inkjet coating.

The method of forming the interference layer, the encapsulation layer, and the linear polarization layer is not limited to the above-described examples, and various suitable processes may be applied. However, in embodiments, the interference layer, the encapsulation layer, and the linear polarization layer may be formed as a single body (e.g., a sole body or a unitary body) with a display panel included in the display apparatus. For example, the interference layer, the encapsulation layer, and the linear polarization layer may be directly formed on the light-emitting element layer, instead of being separately manufactured and attached to the display panel.

In an embodiment, the forming of the linear polarization layer may include: coating, on the encapsulation layer, a coating material including the smectic liquid crystal compound and the dichroic dye compound; and curing the coating material.

In this regard, referring to FIG. 7, the smectic liquid crystal compound may include a material having functional groups at both ends of a molecular structure thereof, and the functional groups may be crosslinked with each other in the curing of the coating material. The smectic liquid crystal compound included in the coating material may be cured and fixed to have a mesh structure, and the dichroic dye compound may be aligned in a corresponding alignment direction according to the alignment of the smectic liquid crystal compound. Therefore, the linear polarization layer may linearly polarize light passing through the linear polarization layer.

In some embodiments, in the curing of the coating material, thermal curing and/or photocuring such as ultraviolet (UV) curing may be applied, but the disclosure is not limited thereto.

According to one or more embodiments, the display apparatus having a relatively small thickness and improved performance for reducing the reflectance of external light and the method of manufacturing the display apparatus may be implemented. The scope of the disclosure, however, is not limited by such an effect.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope of the present disclosure as defined by the following claims, and equivalents thereof.

What is claimed is:

1. A display apparatus comprising:

a substrate;

a light-emitting element layer on the substrate, the light-emitting element layer comprising light-emitting elements;

an interference layer on the light-emitting element layer and including a metal and/or a metal oxide;

an encapsulation layer including a first inorganic encapsulation layer on and in contact with the interference layer, an organic encapsulation layer on the first inorganic layer and having reverse wavelength dispersion characteristics;, and a second inorganic encapsulation layer directly on and in contact with the organic encapsulation layer; and a linear polarization layer on and in contact with the second inorganic encapsulation layer, wherein each of the light-emitting elements comprises a first electrode, a second electrode, and an intermediate layer between the first electrode and the second electrode, and wherein, when light incident to the upper surface of the interference layer from a same side as the upper surface is referred to as incident light and light of the incident light reflected from the upper surface of the interference layer in a direction away from the upper surface of the interference layer is referred to as reflected light, an intensity of the incident light is reduced when the incident light is reflected from the upper surface of the interference layer in the direction away from the upper surface of the interference to form the reflected light.

2. The display apparatus of claim 1, wherein the linear polarization layer comprises a smectic liquid crystal compound and a dichroic dye compound.

3. The display apparatus of claim 2, wherein the smectic liquid crystal compound comprises a smectic A phase.

4. The display apparatus of claim 3, wherein the smectic liquid crystal compound comprises a material having functional groups at both ends of a molecular structure thereof.

5. The display apparatus of claim 4, wherein the smectic liquid crystal compound comprises a material represented by Formula A below:

$$\text{(functional group)}-(X1)n1-\text{(functional group)} \qquad \text{Formula A}$$

wherein, in Formula A, the functional group is an alkylate group or an acrylate group, X1 is a substituted or unsubstituted alkyl group, a substituted or unsubstituted benzene, O, or C(═O), and n1 is an integer from 1 to 50.

6. The display apparatus of claim 2, wherein the dichroic dye compound comprises a compound having at least one azo group.

7. The display apparatus of claim 1, wherein a phase of light passing through the organic encapsulation layer is delayed by $\lambda/4$.

8. The display apparatus of claim 7, wherein the organic encapsulation layer comprises a reactive mesogen.

9. A method of manufacturing a display apparatus, the method comprising:

forming, on a substrate, light-emitting elements each comprising a first electrode, an intermediate layer and a second electrode;

forming an interference layer on the light-emitting elements, the interference layer including a metal and/or a metal oxide;

forming a first inorganic encapsulation layer on and in contact with the interference layer, forming, on the first inorganic encapsulation layer, an organic encapsulation layer having reverse wavelength dispersion characteristics;

forming a second inorganic encapsulation layer directly on and in contact with the organic encapsulation layer; and forming a linear polarization layer on and in contact with the second inorganic encapsulation layer, wherein, when light incident to an upper surface of the interference layer from a same side as the upper surface is referred to as incident light and light of the incident light reflected from the upper surface of the interference layer in a direction away from the upper surface of the interference layer is referred to as reflected light, an intensity of the incident light is reduced when the incident light is reflected from the upper surface of the interference layer in the direction away from the upper surface of the interference to form the reflected light.

10. The method of claim 9, wherein the linear polarization layer comprises a smectic liquid crystal compound and a dichroic dye compound.

11. The method of claim 10, wherein the forming of the linear polarization layer comprises:

coating, on the organic encapsulation layer, a coating material comprising the smectic liquid crystal compound and the dichroic dye compound; and curing the coating material.

12. The method of claim 11, wherein the smectic liquid crystal compound comprises a material having functional groups at both ends of a molecular structure thereof, and the functional groups are crosslinked to each other in the curing of the coating material.

13. The method of claim 12, wherein the smectic liquid crystal compound comprises a material represented by Formula A below:

(functional group)-$(X1)n1$-(functional group) Formula A wherein, in Formula A, the functional group is an alkylate group or an acrylate group, X1 is a substituted or unsubstituted alkyl group, a substituted or unsubstituted benzene, O, or C(=O), and n1 is an integer from 1 to 50.

14. The method of claim 10, wherein the smectic liquid crystal compound comprises a smectic A phase.

15. The method of claim 10, wherein the dichroic dye compound comprises a compound having at least one azo group.

16. The method of claim 9, wherein a phase of light passing through the organic encapsulation layer is delayed by λ/4.

* * * * *